United States Patent [19]

Sawada et al.

[11] Patent Number: 5,818,768
[45] Date of Patent: Oct. 6, 1998

[54] OPERATION MODE SETTING CIRCUIT IN SEMICONDUCTOR DEVICE

[75] Inventors: Seiji Sawada; Yasuhiro Konishi, both of Hyogo, Japan

[73] Assignee: Mitsubishi Denki Kabushiki Kaisha, Tokyo, Japan

[21] Appl. No.: 767,496

[22] Filed: Dec. 16, 1996

[30] Foreign Application Priority Data

Dec. 19, 1995 [JP] Japan .................................. 7-330392

[51] Int. Cl.$^6$ ...................................................... G11C 7/00
[52] U.S. Cl. ........................................... 365/193; 365/194
[58] Field of Search ..................................... 365/193, 194

[56] References Cited

U.S. PATENT DOCUMENTS

| | | | |
|---|---|---|---|
| 4,617,647 | 10/1986 | Hoshi | 365/193 |
| 5,204,837 | 4/1993 | Suwa et al. | 365/193 |
| 5,384,745 | 1/1995 | Konishi et al. | 365/193 |
| 5,400,290 | 3/1995 | Suma et al. | 365/193 |
| 5,539,692 | 7/1996 | Kajigaya et al. | 365/189.01 |
| 5,566,108 | 10/1996 | Kitamura | 365/233 |

FOREIGN PATENT DOCUMENTS 3-102852   4/1991   Japan .

*Primary Examiner*—David C. Nelms
*Assistant Examiner*—Michael T. Tran
*Attorney, Agent, or Firm*—McDermott, Will & Emery

[57] ABSTRACT

A correspondence defining circuit changes a correspondence between an external signal and an internal signal and supplies it to a mode designating signal generating circuit according to a logic state of an operation mode switching signal. The mode designating signal generating circuit activates a mode designating signal which designates a specific operation mode in a semiconductor device when the internal signal satisfies a prescribed condition. An operation mode setting circuit, applicable to applications in which states of external signals are different without a change of its internal structure, is thus provided.

13 Claims, 9 Drawing Sheets

OPERATION MODE SETTING CIRCUIT IN SEMICONDUCTOR DEVICE

BACKGROUND OF THE INVENTION

1. Field of the Invention

The present invention relates to a circuit for setting an operation mode in a semiconductor device, and more particularly, to a structure for setting an internal operation mode of a semiconductor memory device.

2. Description of the Background Art

FIG. 14 schematically shows a structure of a conventional operation mode setting circuit in a semiconductor device. In FIG. 14, the operation mode setting circuit includes a mode set enable generating circuit 1 which generates a mode set enable signal MSET in response to externally supplied signals ext.A, ext.B and ext. C, and a mode set circuit 2 which is enabled in response to the mode set enable signal MSET and activates any of mode designating signals MODEA, MODEB, MODEC, . . . for designating an internal operation mode of the semiconductor device according to a mode specifying data DATA represented by externally supplied signals ext.X, ext.Y and ext. Z. Now with reference to a timing chart shown in FIG. 15, an operation of the structure shown in FIG. 14 will be described.

Mode set enable generating circuit 1 determines that an instruction designating an operation mode in the semiconductor device is supplied when external signals ext.A, ext.B and ext.C are set to prescribed states (all an L level in FIG. 15), and sets mode set enable signal MSET to an H level of an active state. Mode set circuit 2 responds to the activated mode set enable signal MSET, decodes mode specifying data DATA consisting of other externally supplied signals ext.X, ext.Y and ext.Z, and activates a mode designating signal designated by mode specifying data DATA. FIG. 15 shows a state as one example, in which mode designating signal MODEA is activated when the mode specifying data is DATA(A), and mode designating signal MODEB is activated when the mode specifying data is DATA(B).

When the semiconductor device is a semiconductor memory device, a variety of test modes and operation modes are provided for its various functions. One of a plurality of operation modes can be designated by an externally supplied signal which designates a specific operation mode, and the semiconductor memory device can operate in the designated mode.

As shown in FIG. 15, a correspondence between a combination of the states of external signals and a designated operation mode is uniquely defined in a semiconductor device. Since mode set enable generating circuit 1 and mode set circuit 2 are implemented by hardware, their internal structures cannot be easily changed. If the semiconductor device is a Dynamic Random Access Memory (DRAM), for example, a self refresh mode of refreshing memory data is set when a condition of CBR (CAS before RAS; set when a column address strobe signal /CAS falls to L level before the falling of a row address strobe signal /RAS), is satisfied and row address strobe signal /RAS is maintained at L level for a prescribed time period or more under the CBR condition.

When a specific address signal bit is set to a prescribed state under the CBR condition, a specific test mode of this DRAM is designated (the self refresh mode is reset). During a data retention mode, for example, since there is no external access and only a refresh operation for retaining memory data is internally carried out, and a power supply voltage of the DRAM is reduced in order to reduce power consumption by the DRAM to achieve a reduction of power consumption of an external supply source such as a battery. Such a mode is set, for example, using a combination of WCBR (set both write enable signal /WE and column address strobe signal /CAS to L level prior to the falling of row address strobe signal /RAS) condition and an address key condition which sets a specific address signal bit to a prescribed state.

In a data processing system which employs DRAM, if different types of processors are used as external processing units, different conditions of external signals may be utilized by the processors for designating an operation mode of the DRAM. For example, one processor (CPU) which is an external processing unit may use WCBR condition and an address key condition to designate "power down mode" of reducing a supply voltage during the data retention mode, and an other CPU may use the same WCBR condition and an address key condition to designate the "power down mode", while, the states of the address keys utilized in the CPUs may be different. If the condition of the external signals which the other CPU uses for designating an operation mode is employed in order to designate a test mode (a mode of testing for evaluating the performance of DRAM; for example, a stress acceleration test such as the burn-in test for revealing an initial defect) provided in the DRAM, not only a malfunction (not executing the operation mode requested by CPU) but also a destruction of memory data would occur in the DRAM.

In order to accommodate such different conditions of external signals, operation modes to be set in a DRAM and states (conditions) of external signals are required to be determined depending on the CPU (or system) employed. In this case, an internal structure of the mode set circuit should be changed depending on each application (type of the CPU), resulting in the necessity of manufacturing a plurality of DRAMs of different types having the same function, and leading to higher cost.

SUMMARY OF THE INVENTION

An object of the present invention is to provide a semiconductor device capable of having a desired internal operation mode correctly set even if external signals of different states are provided, without changing its internal structure.

Another object of the invention is to provide a semiconductor device capable of having different internal operation modes set according to applications even if external signals of the same state are provided.

An operation mode setting circuit according to the present invention includes circuitry for changing a correspondence between a state of an externally supplied external signal and that of an internal signal in response to an operation mode switching signal.

By changing a correspondence between a state of an externally supplied external signal and a state of an internal signal applied to an internally provided operation mode setting circuit in response to the operation mode switching signal, the invention is applicable to a plurality of different applications without changing the internal structure.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[Overall Structure]

Figure 1:
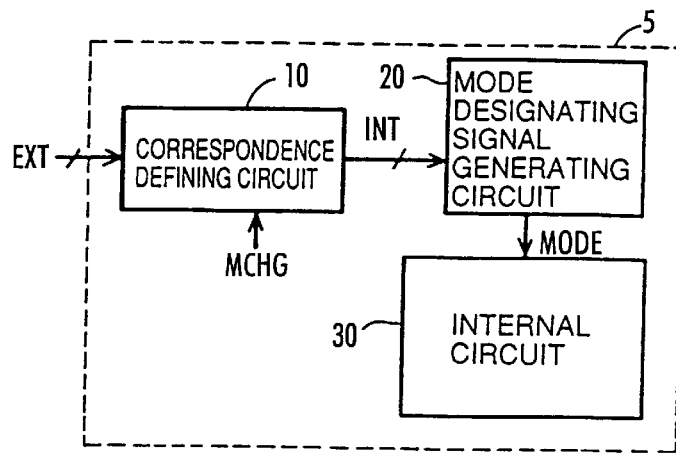
FIG. 1 schematically shows the overall structure of a semiconductor device according to the invention.

FIG. 1 schematically shows the overall structure of a semiconductor device according to the invention. In FIG. 1, a semiconductor device 5 includes a correspondence defining circuit 10 which changes a state of an externally supplied multi-bit external signal EXT for outputting in response to an operation mode switching signal MCHG, a mode designating signal generating circuit 20 which generates a signal MODE designating an operation mode according to the state of an internal signal INT provided from correspondence defining circuit 10, and an internal circuit 30 which operates in the operation mode designated according to operation mode designating signal MODE provided from mode designating signal generating circuit 20.

Correspondence defining circuit 10 passes externally supplied external signal EXT without changing it (a buffer process may be included) and generates internal signal INT when operation mode switching signal MCHG is at a first level, switches the correspondence between the state of the externally supplied external signal EXT and that of internal signal INT and generates internal signal INT when operation mode switching signal MCHG is at a second level.

Internal circuit 30 may be of any structure having a plurality of operation modes and operating in the designated operation mode. One example of such circuit is a DRAM internal circuit.

Figure 2A:
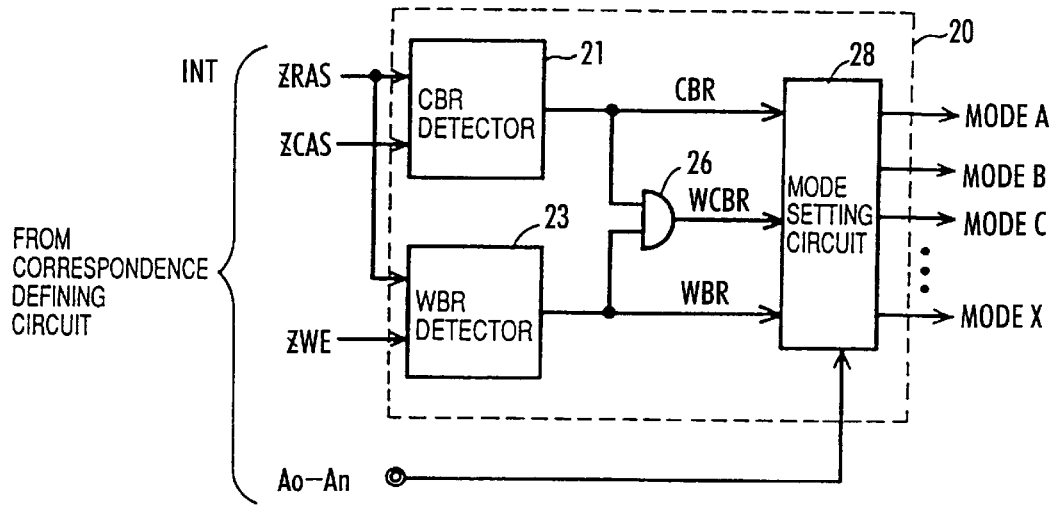
FIGS. 2A and 2B each show one example of a structure of the mode designating signal generating circuit shown in FIG. 1.
Figure 2B:
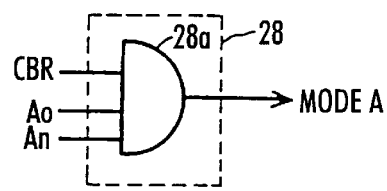

FIGS. 2A and 2B each schematically show one example of a structure of mode designating signal generating circuit 20 shown in FIG. 1. In FIG. 2A, mode designating signal generating circuit 20 sets one of mode designating signals MODEA, MODEB, MODEC, . . . , MODEX to an active state according to the state of internal signal INT provided from correspondence defining circuit 10. In FIG. 2A, the signals utilized in a DRAM as a semiconductor device are exemplified. Internal signal INT thus includes an internal row address strobe signal ZRAS, an internal column address strobe signal ZCAS, an internal write enable signal ZWE and address signal bits Ao–An.

Mode designating signal generating circuit 20 includes: a CBR detector 21 which detects a CBR timing according to the timing relation between internal row address strobe signal ZRAS and internal column address strobe signal ZCAS and outputs a CBR detection signal CBR; a WBR detector 23 which detects a WBR timing (write enable before RAS: write enable signal /WE is set to L level at a timing prior to the falling of external row address strobe signal /RAS (ZRAS) to L level) and activates a WBR detection signal WBR; an AND circuit 26 which performs the logical product operation of CBR detection signal CBR and WBR detection signal WBR and outputs a WCBR detection signal WCBR representing that WCBR condition is satisfied; and a mode setting circuit 28 which sets one of mode designating signals MODEA–MODEX to an active state according to CBR detection signal CBR, WCBR detection signal WCBR and WBR detection signal WBR, as well as to address signal bits Ao–An. Address signal bits Ao–An may be prescribed specific address signal bits among those of externally provided address signal, and the number of the utilized address signal bits is appropriately determined.

FIG. 2B shows one example of a structure of the mode designating signal generating portion included in mode setting circuit 28. In FIG. 2B, mode setting circuit 28 includes an AND circuit 28a which activates mode designating signal MODEA when CBR detection signal CBR and address signal bits Ao and A1 are all at H level. Mode setting circuit 28 includes a logic circuit for determining if a prescribed combination of states of signals is satisfied for respective mode designating signals MODEA–MODEX.

The present invention is applied to a DRAM as one example. The name and the kinds of the employed signals vary depending on the type of DRAM employed, so that control signals for controlling an access operation to a memory are denoted by characters A–C, and address signal bits are denoted by characters Z–X in the following description.

[First Embodiment]

Figure 3A:
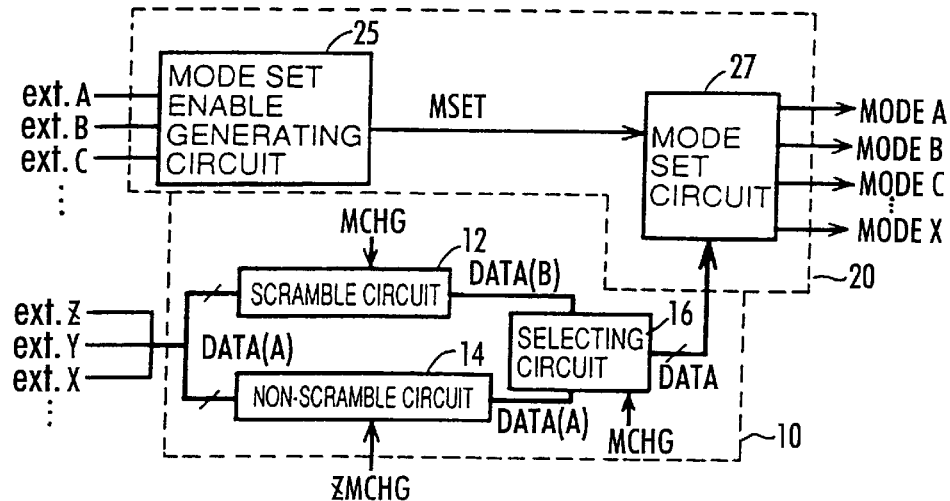
FIG. 3A schematically shows a structure of a correspondence defining circuit according to the first embodiment of the invention.

FIG. 3A schematically shows a structure of an operation mode setting circuit according to the first embodiment of the invention. In the structure shown in FIG. 3A, a cycle of designating a specific operation mode is determined according to the states of a first set of externally supplied external signals ext.A–ext.C, an operation mode is specified according to the combination of the states of a second se of externally supplied second set of external signals ext.Z–ext.X, and a correspondence between the second set of external signals ext.Z–ext.X and an internal signal DATA is switched according to the logic level of operation mode switching signal MCHG.

In FIG. 3A, correspondence defining circuit 10 includes a scramble circuit 12 which is activated when operation mode switching signal MCHG is at a first level and scrambles a combination DATA(A) of the states of the second set of externally applied external signals ext.Z–ext.X, a non-scramble circuit 14 which is activated in response to the activation of a complementary signal ZMCHG of operation mode switching signal MCHG to buffer and pass combination DATA(A) of the states of the second set of external signals ext.Z–ext.X, and a selecting circuit 16 which selects either the output signal of scramble circuit 12 or that of non-scramble circuit 14, according to the logic level of operation mode switching signal MCHG.

Selecting circuit 16 selects a combination DATA(B) of the states output from scramble circuit 12 for application to mode designating signal generating circuit 20 when operation mode switching signal MCHG is at a first logic level, and selects combination DATA(A) of the states supplied from non-scramble circuit 14 for application to mode designating signal generating circuit 20 when operation mode switching signal MCHG is at a second level.

Mode designating signal generating circuit 20 includes a mode set enable generating circuit 25 which determines whether the states of first set of external signals ext.A–ext.C satisfy a prescribed condition, and a mode set circuit 27 which is activated in response to mode set enable signal MSET from mode set enable generating circuit 25 and sets one of operation mode designating signals MODEA–MODEX to an active state according to internal signal DATA as a mode specifying data supplied from selecting circuit 16 in correspondence defining circuit 10.

Figure 3B:
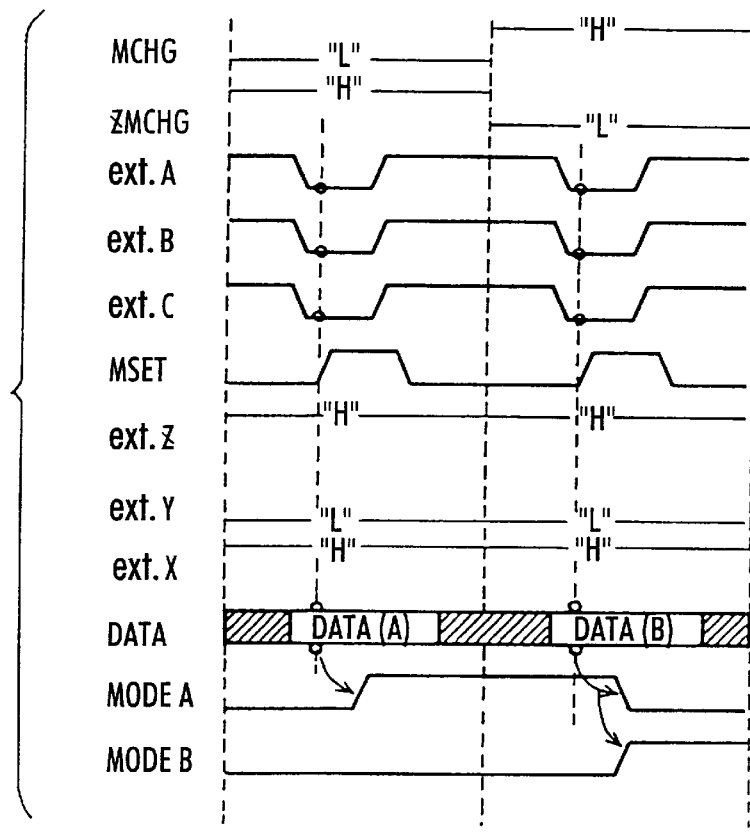
FIG. 3B is a timing chart representing its operation.

Mode set enable generating circuit 25 activates mode set enable signal MSET when external signals ext.A–ext.C satisfy a prescribed condition. Mode set circuit 27 is activated in response to mode set enable signal MSET in the active state, to decode internal signal DATA to activate a corresponding mode designating signal. Mode set enable signal MSET corresponds to signals CBR, WCBR or WBR shown in FIG. 2, and combination DATA of the states corresponds to address signal bits A0–An shown in FIG. 2. An operation of the operation mode setting circuit shown in FIG. 3A will be described referring to a timing chart of FIG. 3B.

When operation mode switching signal MCHG is at an L level, operation mode switching signal ZMCHG is at an H level. In this case, scramble circuit 12 is inactivated and non-scramble circuit 14 is activated, so that selecting circuit 16 selects combination DATA(A) of the states applied from non-scramble circuit 14. When external signals ext.A–ext.C are set to prescribed states (all L level in FIG. 3B), mode set enable generating circuit 25 determines that an operation mode selecting cycle is designated, and sets mode set enable signal MSET to an active state of H level. Under this condition, when the states of the second set of external signals ext.Z, ext.Y and ext.X are, for example, "H", "L", and "H" respectively, combination DATA(A) of the states output from non-scramble circuit 14 is the same as the combination of the states of external signals ext.Z–ext.X and internal signal DATA output from selecting circuit 16 corresponds to the state of combination DATA(A) of the states. Mode set circuit 27 activates one of mode designating signals MODEA–MODEX (signal MODEA in FIG. 3A) according to internal signal DATA(DATA(A)).

When mode switching signal MCHG is at H level, and operation mode switching signal ZMCHG is at L level, scramble circuit 12 is activated and non-scramble circuit 14 is inactivated. Under this condition, when external signals ext.Z–ext.X satisfy the same combination DATA(A) of the states, scramble circuit 12 scrambles the states and outputs another combination DATA(B) of the states. Selecting circuit 16 selects combination DATA(B) of the states supplied from scramble circuit 12 for application to mode designating signal generating circuit 20 according to operation mode switching signal MCHG at H level. In this case, therefore, mode set circuit 27 activates mode designating signal MODEB which designates a different operation mode from that designated by combination DATA(A) of the states.

As described above, even if the second set of external signals ext.Z–ext.X is in the same state, the operation mode to be designated can be internally switched by changing the logic level of operation mode switching signal MCHG. Therefore, the operation mode to be specified can be switched by activating either scramble circuit 12 or non-scramble circuit 14 according to applications without changing the internal structure, making a semiconductor device applicable to a plurality of different applications without changing its structure.

In the above description, the same combination DATA(A) of the states is internally switched according to the states of operation mode switching signals MCHG and ZMCHG and a different operation mode is designated. This is equivalent to the case in which the same operation mode can be internally designated according to the logic state of operation mode switching signal MCHG when the second set of external signals ext.Z–ext.X is set to a different state.

Figure 4A:
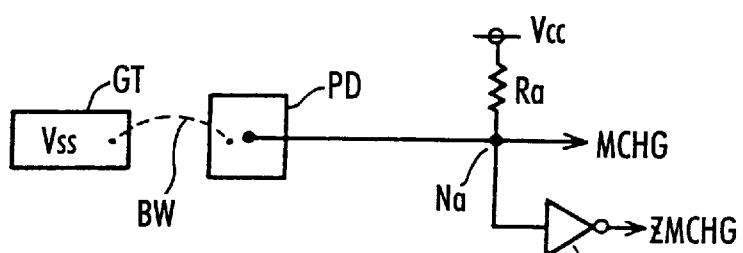
FIGS. 4A–4C each show a structure of a portion which generates the operation mode switching signal shown in FIG. 1.
Figure 4B:
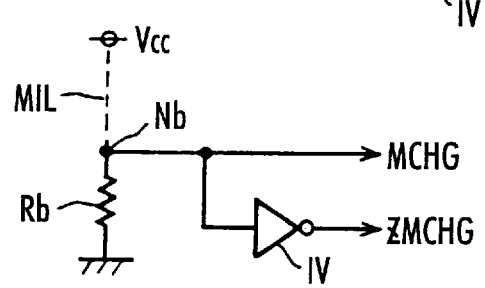
Figure 4C:
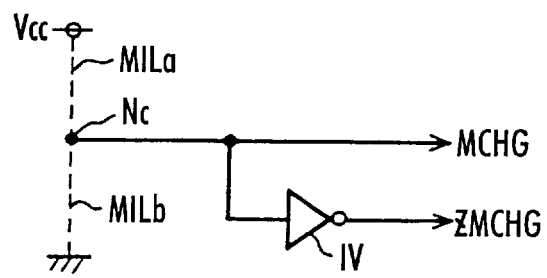

FIGS. 4A–4C each schematically show a structure of a portion which generates operation mode switching signals MCHG and ZMCHG. In FIG. 4A, an operation mode switching signal generating portion includes a resistance element Ra of high resistance connected between an internal node Na connected to a pad PD and a supply node Vcc, and an inverter IV which inverts the potential on node Na. Operation mode switching signal MCHG is output from node Na, and complementary operation mode switching signal ZMCHG is output from inverter IV. When pad PD is, for example, connected via a bonding wire BW to a ground terminal GT which externally receives ground potential Vss, operation mode switching signal MCHG is fixed at L level. On the other hand, when bonding wire BW is not provided so that pad PD and ground terminal GT are isolated, node Na is maintained at supply potential Vcc level by resistance element Ra, and operation mode switching signal MCHG is set to H level. Operation mode switching signals MCHG and ZMCHG can be accordingly set to a required logic level, by determining if bonding wire BW should be connected between pad PD and ground terminal GT according to the application of the semiconductor device.

In the structure shown in FIG. 4A, node Na may be coupled to the ground potential via resistance element Ra, and pad PD may be selectively connected via a bonding wire to a supply terminal which receives power supply potential Vcc.

FIG. 4B illustrates another structure of the operation mode switching signal generating portion. In the structure shown in FIG. 4B, a resistance element Rb of high resistance is provided between an internal node Nb which outputs operation mode switching signal MCHG and a ground node. Between internal node Nb and supply node Vcc, an interconnection MIL is selectively formed in accordance with the application by changing a mask for an interconnection patterning in the process of manufacturing. Internal node Nb is set to a supply potential Vcc level when mask interconnection MIL is provided, and internal node Nb is fixed to ground potential level via resistance element Rb when mask interconnection MIL is not provided. Complementary operation switching signal ZMCHG is output by inverting the potential on internal node Nb through inverter IV.

FIG. 4C illustrates still another structure of the operation mode switching signal generating portion. In the structure shown in FIG. 4C, an internal node Nc which outputs operation mode switching signal MCHG is electrically connected to supply node Vcc or a ground node through a mask interconnection. Internal node Nc is maintained at a supply potential Vcc level when a mask interconnection MILa is provided and a mask interconnection MILb is not provided. On the other hand, when mask interconnection MILa is not provided and mask interconnection MILb is provided, internal node Nc is fixed at ground potential level. Complementary operation mode switching signal ZMCHG is generated by inverting signal MCHG on internal node Nc through inverter IV.

As shown in FIGS. 4B and 4C, with the structure that the potential of internal node Nb or Nc is established using mask interconnection MIL, MILa or MILb, the operation mode switching signal generating portion can be placed in a desired position of a semiconductor device (because a supply line and a ground line are extended over the inside of the semiconductor device).

Figure 5:
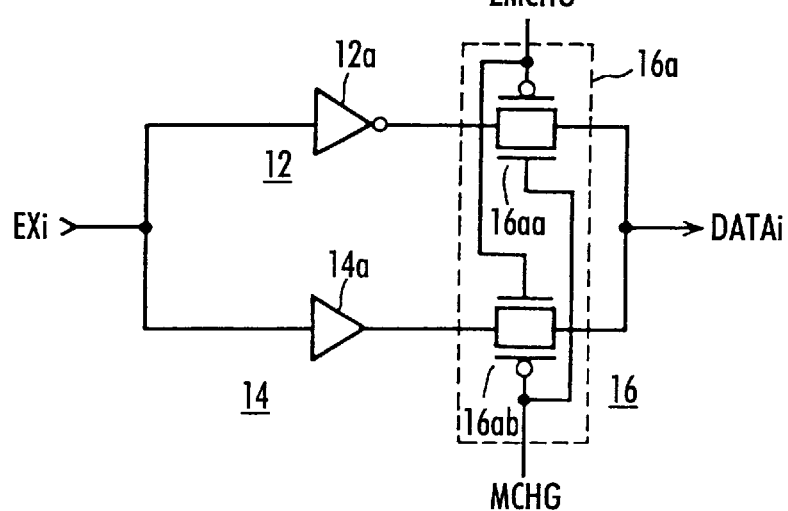
FIG. 5 shows a specific structure of a correspondence defining circuit according to the first embodiment of the invention.

FIG. 5 shows one example of a structure of a scramble, non-scramble and a selecting circuits for an external signal of 1 bit. In FIG. 5, scramble circuit 12 includes an inverter 12a, and non-scramble circuit 14 includes a buffer 14a. A selecting circuit 16a includes a CMOS transmission gate 16aa which becomes conductive to pass an output signal from inverter 12a in scramble circuit 12 when operation mode switching signal MCHG is at H level, and a CMOS transmission gate 16ab which becomes conductive to pass an output signal from buffer 14a in non-scramble circuit 14 when operation mode switching signal MCHG is at L level. According to the structure shown in FIG. 5, when operation mode switching signal MCHG is set to H level, an external signal bit EXi is inverted by inverter 12a and output as an internal signal DATAi. Buffer 14a may not be provided.

Figure 6:
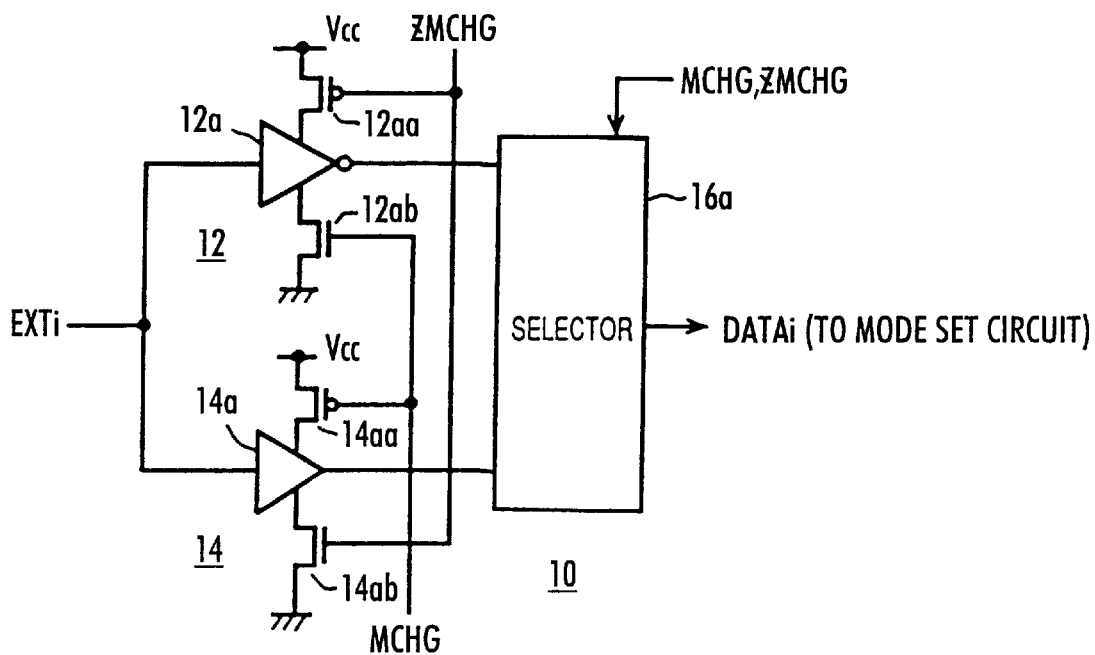
FIG. 6 shows a modification of a correspondence defining circuit according to the invention.

FIG. 6 illustrates a structure of a modification of correspondence defining circuit 10 shown in FIG. 3A. In FIG. 6, a structure of the portion concerning external signal EXTi of 1 bit and internal signal DATAi of 1 bit is shown. Non-scramble circuit 14 of FIG. 6 includes buffer 14a which buffers external signal EXTi, a p channel MOS transistor 14aa which is coupled between one supply node of buffer 14a and supply node Vcc and receives operation mode switching signal MCHG at its gate, and an n channel MOS transistor 14ab which is connected between the other supply node (ground node) of buffer 14a and a ground node and receives complementary operation mode switching signal ZMCHG at its gate.

Scramble circuit 12 includes inverter 12a which receives external signal EXTi, a p channel MOS transistor 12aa which is connected between one supply node of inverter 12a and supply node Vcc and receives complementary operation mode switching signal ZMCHG at its gate, and an n channel MOS transistor 12ab which is connected between the other supply node of inverter 12a and a ground node and receives operation mode switching signal MCHG at its gate. Output signals of buffer 14a and inverter 12a are respectively provided to selector 16a. Selector 16a includes, for example, CMOS transmission gates which complementarily become conductive and constitute a one bit portion of the output signal of the selecting circuit 10.

In the structure shown in FIG. 6, when operation mode switching signal MCHG is at H level, MOS transistors 14aa and 14ab are set to a non-conducting state, and a current path between supply node Vcc and the ground node through buffer 14a is cut off. MOS transistors 12aa and 12ab are set to an on state and a current path between supply node Vcc and the ground node is formed, so that inverter 12a inverts external signal EXTi for outputting. Therefore, current is consumed only by inverter 12a, not by buffer 14a.

On the other hand, when operation mode switching signal MCHG is at L level, MOS transistors 12aa and 12ab are set to a non-conducting state, and MOS transistors 14aa and 14ab are set to a conducting state. In this case, buffer 14a buffers external signal EXTi and outputs it, while inverter 12a does not operate. Accordingly, current consumption can be reduced since only one of inverter 12a and buffer 14a is set to an operable state.

As described above, according to the first embodiment of the invention, the semiconductor device is structured such that a correspondence between the state of an external signal and that of an internal signal is changed according to an operation mode switching signal, and then a semiconductor device which is applicable to a plurality of applications with one chip could be implemented.

[Second Embodiment]

Figure 7:
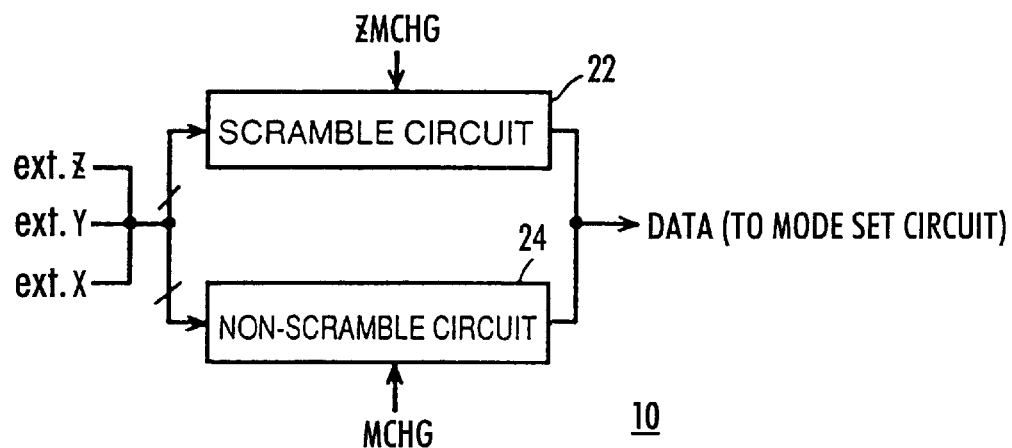
FIG. 7 schematically shows a structure of a correspondence defining circuit according to the second embodiment of the invention.

FIG. 7 illustrates a structure of a main portion in a semiconductor device according to the second embodiment of the invention. In FIG. 7, only correspondence defining circuit 10 is shown.

Correspondence defining circuit 10 of FIG. 7 includes a scramble circuit 22 which is set to an operating state when operation mode switching signal ZMCHG is at H level and set to an output high impedance state when operation mode switching signal ZMCHG is at L level, and a non-scramble circuit 24 which is set to an operating state when operation mode switching signal MCHG is at H level and set to an output high impedance state when operation mode switching signal MCHG is at L level. External signals ext.Z–ext.X are supplied to both of scramble circuit 22 and non-scramble circuit 24.

Since scramble circuit 22 and non-scramble circuit 24 are set to an output high impedance state when they are in an inactive state, a selecting circuit is not provided at the output portions of scramble circuit 22 and non-scramble circuit 24. The operation of correspondence defining circuit 10 shown in FIG. 7 is similar to that of the correspondence defining circuit shown in the first embodiment.

According to the structure shown in FIG. 7, a selecting circuit is not required, thus the area occupied by the circuit can be reduced.

Figure 8:
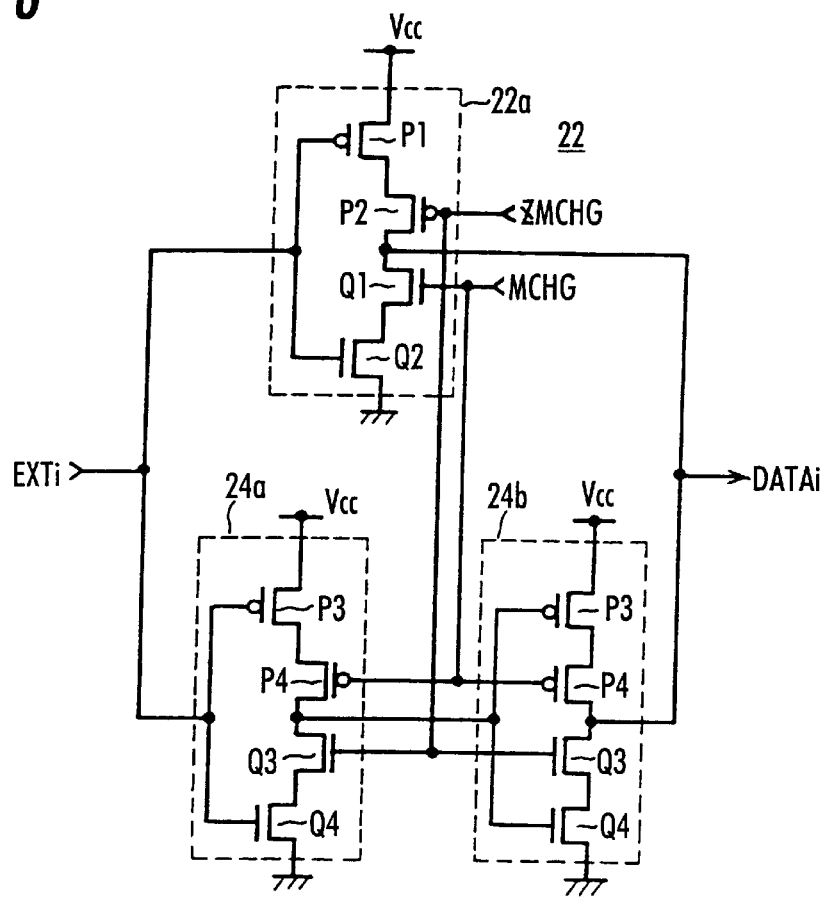
FIG. 8 shows a specific structure of the scramble circuit and the non-scramble circuit shown in FIG. 7.

FIG. 8 illustrates a structure of a portion external signal EXTi of 1 bit in correspondence defining circuit 10 shown in FIG. 7.

In FIG. 8, scramble circuit 22 includes a three-state inverter 22a which is set to an output high impedance state when operation mode switching signal MCHG is at L level. Three-state inverter 22a includes: a p channel MOS transistor P1 which has one conduction node connected to a supply node and a control electrode node (gate) receiving external signal EXTi; a p channel MOS transistor P2 which has one conduction node connected to the other conduction node of MOS transistor P1, the other conduction node connected to an output node, and a control electrode node receiving operation mode switching signal ZMCHG; an n channel MOS transistor Q1 which has one conduction node connected to an output node and a control electrode node receiving operation mode switching signal MCHG; and an n channel MOS transistor Q2 which has one conduction node connected to the other conduction node of MOS transistor Q1, the other conduction node connected to a ground node, and a control electrode node receiving external signal EXTi.

Non-scramble circuit 24 includes two stages of cascade connected three-state inverters 24a and 24b. Three state inverters 24a and 24b are of the same structure, and an output signal of three state inverter 24a is supplied to an input portion of three state inverter 24b.

Three state inverter 24a includes: a p channel MOS transistor P3 which has one conduction node connected to supply node Vcc and a control electrode node receiving external signal EXTi; a p channel MOS transistor P4 which has one conduction node connected to the other conduction node of MOS transistor P3, a control electrode node receiving operation mode switching signal MCHG, and the other conduction node connected to an output node; an n channel MOS transistor Q3 which has one conduction node connected to an output node and a control electrode node receiving operation mode switching signal ZMCHG; and an n channel MOS transistor Q4 which has one conduction node connected to the other conduction node of MOS transistor Q3, the other conduction node connected to a ground node, and a control electrode node receiving external signal EXTi.

An output signal of three-state inverter 24a is supplied to the control electrode nodes of MOS transistors P3 and Q4 included in three-state inverter 24b. The output nodes of three-state inverters 22a and 24b are connected together, and from one which internal signal DATAi is generated.

When operation mode switching signal MCHG is at H level, MOS transistors P2 and Q1 are set to a conducting state, and MOS transistors Q3 and P4 are set to a non-conducting state. Three-state inverters 24a and 24b are thus set to an output high impedance state, while three-state inverter 22a operates as an inverter. On the contrary, when operation mode switching signal MCHG is at L level, MOS transistors Q1 and P2 are set to a non-conducting state, and MOS transistors Q3 and P4 are set to a conducting state. In this case, three-state inverter 22a is set to an output high impedance state, and three-state inverters 24a and 24b both operate as an inverter. Therefore, when an operation mode switching signal MCHG is at H level, internal signal DATAi would be the inverted signal of external signal EXTi, while internal signal DATAi has the same logic as that of external signal EXTi when operation mode switching signal MCHG is at L level.

As described above, according to the second embodiment of the invention, since the scramble circuit and the non-scramble circuit are structured such that they are set to an output high impedance state according to the logic state of operation mode switching signal MCHG in the correspondence defining circuit which changes a correspondence between the state of an internal signal and that of an external signal, a selecting circuit is not required, resulting in the reduction of the area occupied by the circuit.

[Third Embodiment]

Figure 9:
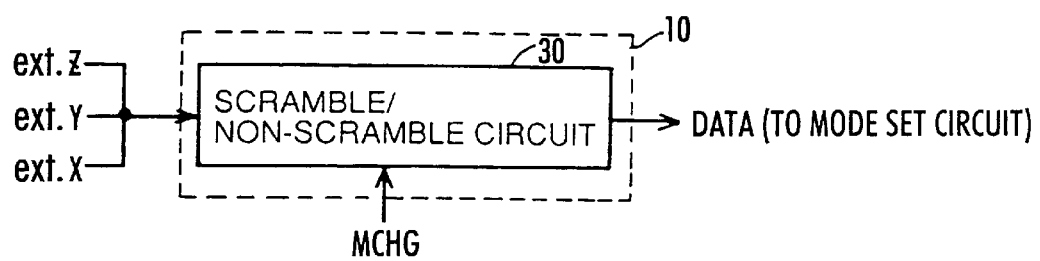
FIG. 9 schematically shows a structure of a correspondence defining circuit according to the third embodiment of the invention.

FIG. 9 illustrates a structure of a main portion in a semiconductor device according to the third embodiment of the present invention. Only the portion of correspondence defining circuit 10 is shown in FIG. 9. Other structures are the same as those of the first and the second embodiment. In FIG. 9, correspondence defining circuit 10 includes a scramble/non-scramble circuit 30 which functions as a scramble or a non-scramble circuit according to operation mode switching signal MCHG.

Scramble/non-scramble circuit 30 receives external signals ext.X–ext.Z, the states of which signals are changed/not changed in response to the logic level of operation mode switching signal MCHG, and internal signal DATA is output. In the structure shown in FIG. 10, one circuit has both functions of a scramble and a non-scramble circuits, and implements the functions of two circuits. Reduction of the area occupied by the circuit can thus be achieved.

Figure 10A:
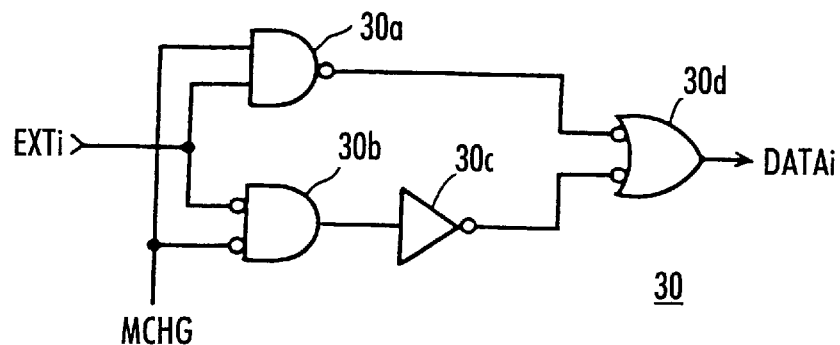
FIGS. 10A and 10B each show a structure of the scramble/non-scramble circuit shown in FIG. 9.
Figure 10B:
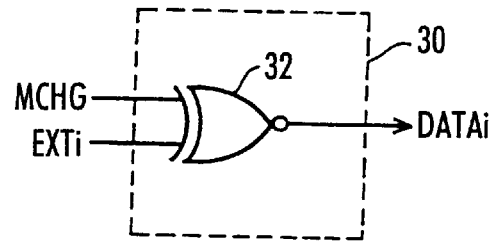

FIGS. 10A and 10B each show one example of a structure of scramble/non-scramble circuit 30 in FIG. 9. Only the structure of the portion which corresponds to external signal EXTi of 1 bit is shown in FIGS. 10A and 10B.

In FIG. 10A, scramble/non-scramble circuit 30 includes an NAND circuit 30a which receives operation mode switching signal MCHG and external signal EXTi, an NOR circuit 30b which receives operation mode switching signal MCHG and external signal EXTi, an inverter 30c which receives an output signal of NOR circuit 30b, and an NAND circuit 30d which receives an output signal of NAND circuit 30a and an output signal of inverter 30c.

When an operation mode switching signal MCHG is at H level, the output signal of NOR circuit 30b is fixed at L level, and the output signal of inverter 30c is fixed at H level. In this case, NAND circuit 30d functions as an inverter according to the output signal of inverter 30c at H level. NAND circuit 30a functions as an inverter according to operation mode switching signal MCHG at H level. When operation mode switching signal MCHG is at H level, internal signal DATAi which has a logic corresponding to that of external signal EXTi is accordingly generated.

On the other hand, when operation mode switching signal MCHG is at L level, the output signal of NAND circuit 30a is fixed at H level, and NOR circuit 30d functions as an inverter. NOR circuit 30b functions as an inverter, inverting external signal EXTi. An inverted external signal EXTi is accordingly output as internal signal DATAi when operation mode switching signal MCHG is at L level.

It is noted that the structure shown in FIG. 10A is set to a non-scrambling state when operation mode switching signal MCHG is at H level, and set to a scrambling state when operation mode switching signal MCHG is at L level. In order to attain the scramble/non-scramble state similar to that of above embodiment, just complementary operation mode switching signal ZMCHG may be used instead of operation mode switching signal MCHG.

FIG. 10B illustrates a structure of a modification of scramble/non-scramble circuit 30. FIG. 10B shows a structure of the portion which corresponds to external signal EXTi of 1 bit. In FIG. 10B, scramble/non-scramble circuit 30 includes an EXNOR circuit 32 which receives operation mode switching signal MCHG and external signal EXTi. When operation mode switching signal MCHG is at H level, EXNOR circuit 32 operates as a buffer and generates internal signal DATAi corresponding to external signal EXTi. On the other hand, when operation mode switching signal MCHG is at L level, EXNOR circuit 32 operates as an inverter and outputs a signal of inverted external signal EXTi as internal signal DATAi.

In the structure shown in FIG. 10B, operation mode switching signal ZMCHG may also be utilized instead of signal MCHG which sets the scramble/non-scramble state.

Figure 11:
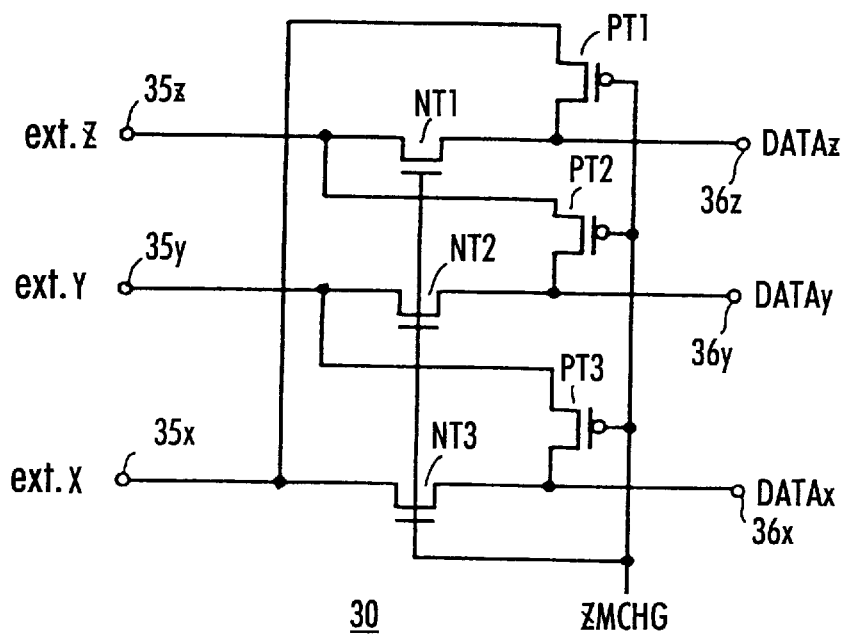
FIG. 11 shows one example of a structure of a correspondence defining circuit in a semiconductor device according to the fourth embodiment of the invention.

FIG. 11 illustrates a structure of the second modification of scramble/non-scramble circuit 30 shown in FIG. 9. In the structure shown in FIG. 11, a connection path between an input node and an output node of the scramble/non-scramble circuit is switched according to operation mode switching signal ZMCHG (MCHG). A correspondence between external signals ext.X–ext.Z and a combination DATA of the internal states is changed accordingly.

In FIG. 11, scramble/non-scramble circuit 30 includes: a transfer gate NT1 formed of an n channel MOS transistor provided between external signal ext.Z and an output node 36z; a transfer gate NT2 formed of an n channel MOS transistor connected between an input node 35y and an output node 36y; a transfer gate NT3 formed of an n channel MOS transistor provided between an input node 35x and an output node 36x; a transfer gate PT1 formed of a p channel MOS transistor provided between input node 35x and output node 36z; a transfer gate PT2 formed of a p channel MOS transistor provided between an input node 35z and output node 36y; and a transfer gate PT3 formed of a p channel MOS transistor provided between input node 35y and output node 36x.

External signals ext.X, ext.Y and ext.Z are respectively supplied to input nodes 35x, 35y and 35z, and internal signals DATAx, DATAy and DATAz are output from output nodes 36x, 36y and 36z. Operation mode switching signal ZMCHG is provided to control electrode nodes of transfer gates NT1–NT3 and PT1–PT3. The operation will be next described.

When operation mode switching signal ZMCHG is at H level, transfer gates NT1–NT3 are in a conducting state and transfer gates PT1–PT3 are in a non-conducting state. External signals ext.Z, ext.Y and ext.X respectively applied to input nodes 35z, 35y and 35x are accordingly provided to output nodes 36z, 36y and 36x. Therefore, internal signals DATAx, DATAy and DATAz are respectively identical to external signals ext.X, ext.Y and ext.Z.

On the other hand, when operation mode switching signal ZMCHG is at L level, transfer gates NT1–NT3 are set to a non-conducting state, and transfer gates PT1–PT3 are set to a conducting state. In this case, external signal ext.Z supplied to input node 35z is provided to output node 36y, external signal ext.Y supplied to input node 35y is provided to output node 36x, and external signal ext.X supplied to input node 35x is provided to output node 36z. Therefore, internal signals DATAx, DATAy and DATAz respectively correspond to external signals ext.Y, ext.Z and ext.X.

Using the scramble/non-scramble circuit shown in FIG. 11, the scramble/non-scramble function can be selectively attained according to the logic level of operation mode switching signal ZMCHG (MCHG).

According to the third embodiment of the invention described above, a correspondence between an internal signal and an external signal is established by switching a signal propagation path or a logic using operation mode switching signal ZMCHG, so that a scramble circuit and a non-scramble circuit do not need to be provided separately. As for the switching of a signal propagation path, a logic gate such as an inverter is not necessary, resulting in the reduction of the number of components and of the area occupied by the circuit.

[Fourth Embodiment]

Figure 12A:
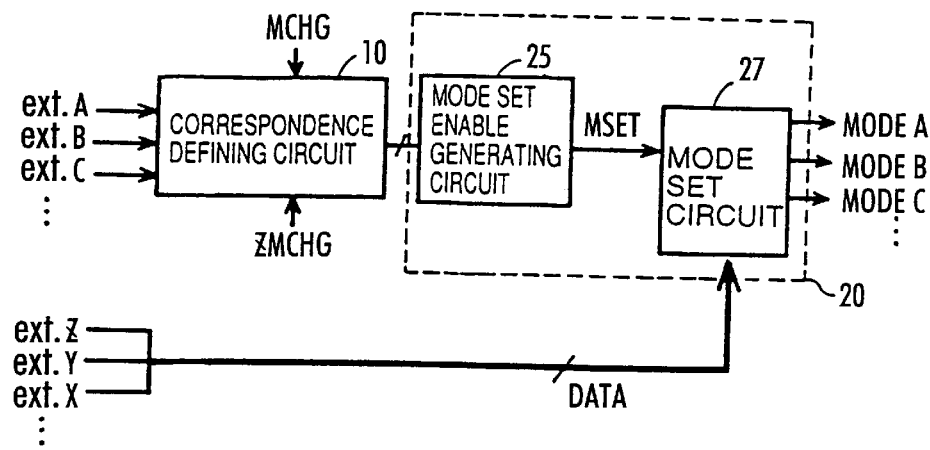
FIG. 12A schematically shows a main structure of a semiconductor device according to the fifth embodiment of the invention.

FIG. 12A illustrates a structure of a main portion in a semiconductor device according to the fourth embodiment. In FIG. 12A, correspondence defining circuit 10 is provided for external (control) signals ext.A, ext.B and ext.C which designate a mode according to a timing condition. The correspondence defining circuit is not provided for external signals ext.Z, ext.Y and ext.X, such as address signal bits, which specify an operation mode according to the logic values. The internal structure of correspondence defining circuit 10 may be any of those according to the first to third embodiments described above.

Figure 12B:
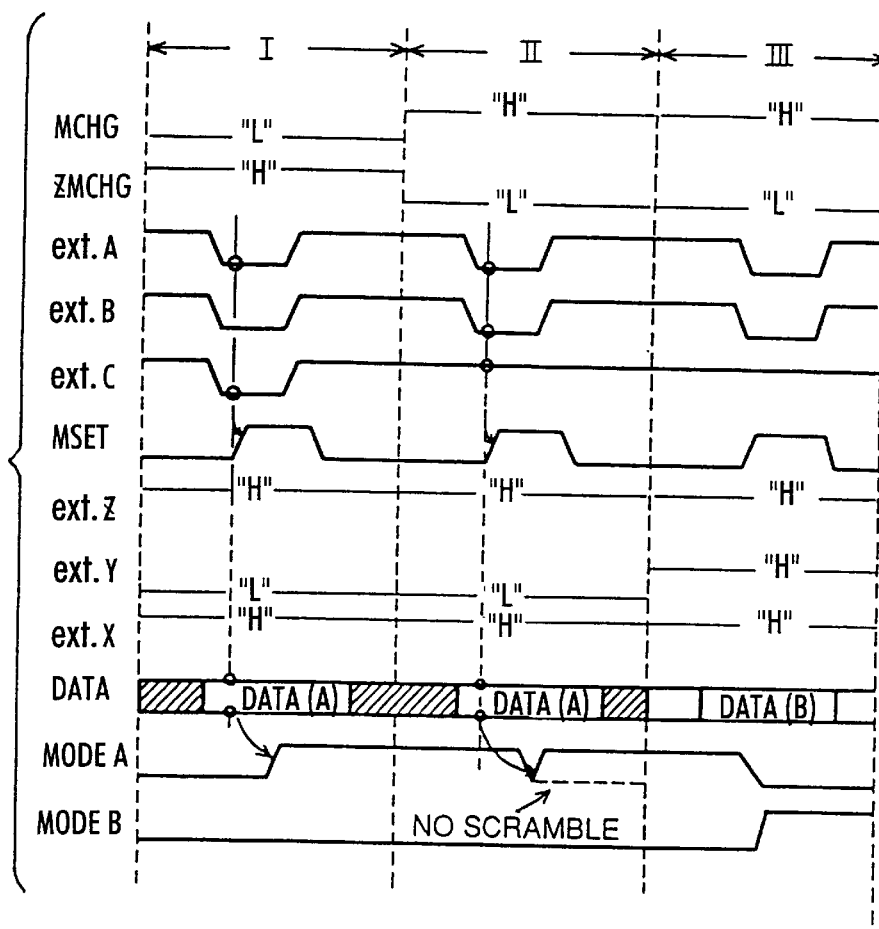
FIG. 12B is a timing chart showing its operation.

A signal from correspondence defining circuit 10 and combination DATA of the states of external signals are supplied to mode designating signal generating circuit 20. The structure of mode designating signal generating circuit 20 is identical to those according to the first to the third embodiments. In the structure shown in FIG. 12A, a timing condition can be changed by correspondence defining circuit 10. Now with reference to a timing chart shown in FIG. 12B, the structure in FIG. 12A will be described.

In the section I, operation mode switching signal MCHG is set to L level, and operation mode switching signal ZMCHG is set to H level. If external signals ext.A, ext.B and ext.C satisfy a prescribed timing condition (e.g. WCBR), mode set enable generating circuit 25 determines that an operation mode setting cycle is designated, and sets mode set enable signal MSET to an active state of H level. When external signals ext.Z, ext.Y and ext.X are respectively H, L and H, corresponding internal signals, are represented as a combination DATA(A) of the states. Mode set circuit 27 is activated in response to mode setting enable signal MSET, and activates mode designating signal MODEA according to combination of the internal states DATA(A).

In the section II, operation mode switching signal MCHG is set to H level and operation mode switching signal ZMCHG is set to L level. When external signals ext.A and ext.B are at L level, and external signal ext.C is at H level (e.g. CBR condition), a correspondence between the external signals and the internal signals is switched and the internal signals are provided to mode set enable generating circuit 25 by correspondence defining circuit 10. Since the condition of the signals supplied from correspondence defining circuit 10 are the same as that supplied in the section I, mode set enable generating circuit 25 sets mode set enable signal MSET to an active state of H level. At this time, external signals ext. Z, ext.Y and ext.X are respectively H, L and H as in the section I, and combination of the internal states is DATA(A), so that mode set circuit 27 sets mode designating signal MODEA to an active state of H level. That is, if a different timing condition of external signals is supplied, the same operation mode is designated.

Figure 15:
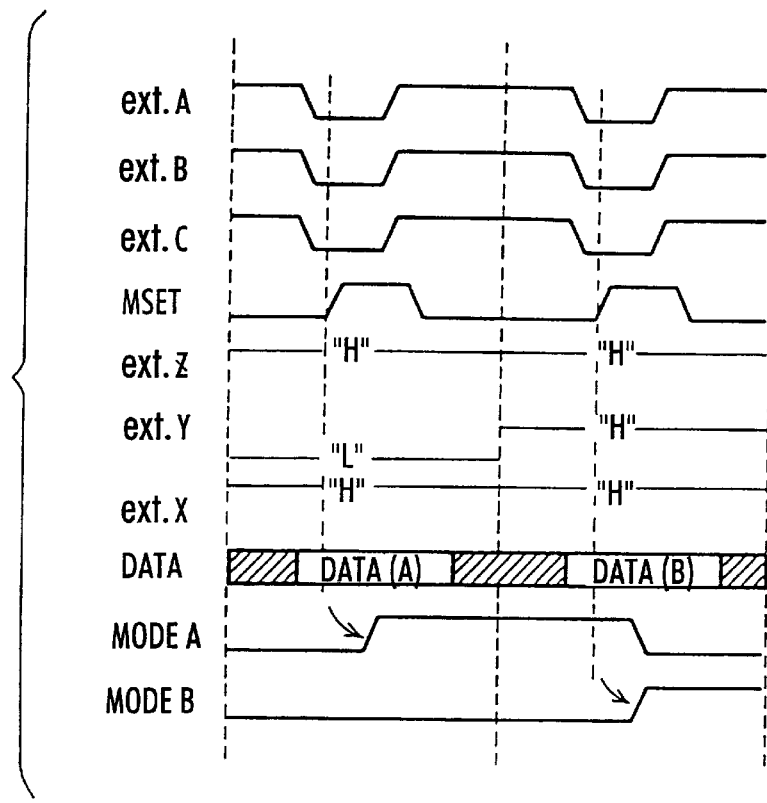
FIG. 15 is a timing chart representing an operation of the conventional operation mode setting circuit shown in FIG. 14.

In the section III, operation mode switching signal MCHG is set to H level, and complementary operation mode switching signal ZMCHG is set to L level. Under this condition, external signals ext.A and ext.B are set to L level, while external signal ext.C is set to H level as in the section II. In this case, correspondence between the external signals and the internal signals is changed by correspondence defining circuit 10 as in the section II, so that mode set enable generating circuit 25 sets mode set enable signal MSET to an active state of H level. At this time, if external signals ext.Z, ext.Y and ext.X are all at H level, that is, a combination of the internal states is DATA(B), mode designating signal MODEB is activated and mode designating signal MODEA is maintained in non-active state as was described with reference to FIG. 15. The same operation mode can thus be designated even if external signals are at different states.

According to the fourth embodiment of the invention, for external signals which designate an operation mode along their timing condition, a correspondence between the external signals and internal signals is changed according to an operation mode switching signal, so that the same operation mode can be designated even if external signals are at different conditions, and a different operation mode can be specified even if external signals are supplied with the same timing condition.

[Fifth Embodiment]

Figure 13A:
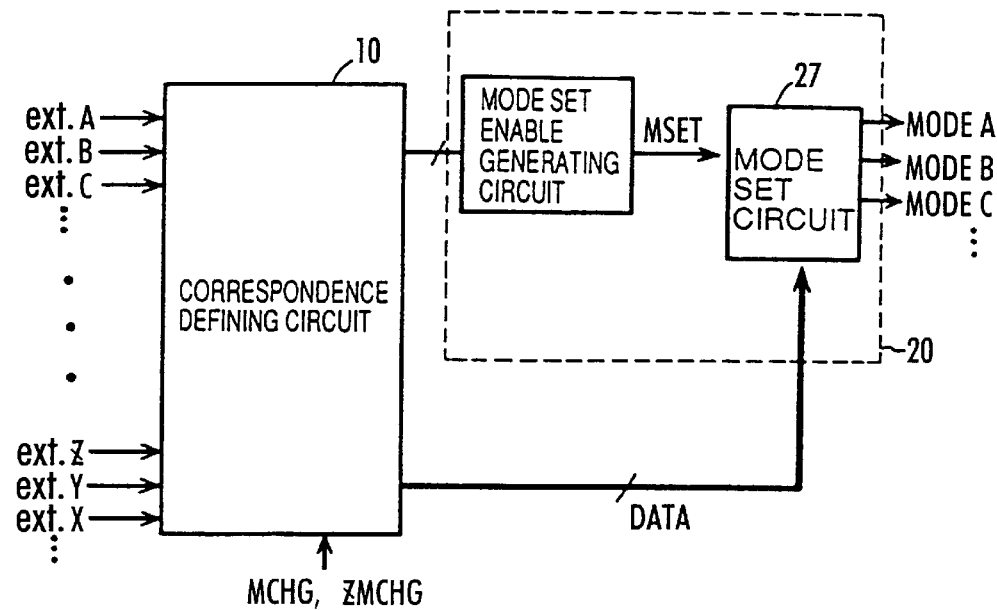
FIG. 13A illustrates a main structure of a semiconductor device according to the sixth embodiment of the invention.
Figure 13B:
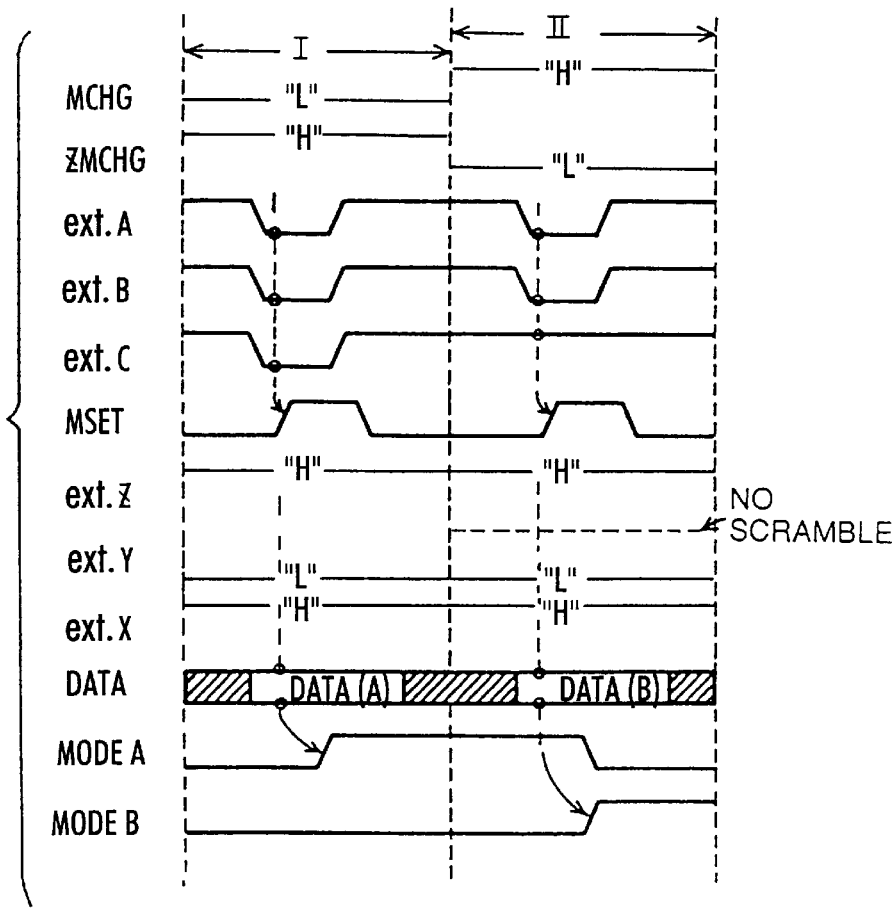
FIG. 13B is a timing chart representing its operation.
Figure 14:
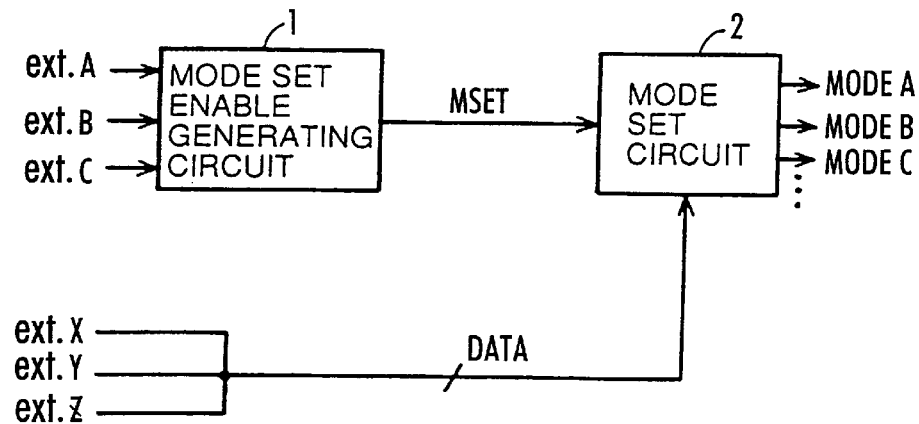
FIG. 14 schematically shows a structure of an operation mode setting circuit in a conventional semiconductor device.

FIG. 13A illustrates a structure of a main portion in a semiconductor device according to the fifth embodiment of the invention. In the structure shown in FIG. 13A, correspondence defining circuit 10 which defines a correspondence between external signals and internal signals receives all of a first set of external signals ext.A, ext.B and ext.C which specify a mode along their timing condition, and a second set of external signals ext.X, ext.Y and ext.Z which specify an operation mode along their logic values. An internal signal from correspondence defining circuit 10 is supplied to mode designating signal generating circuit 20. The structure of mode designating signal generating circuit 20 is the same as those according to the first to fourth embodiments, and corresponding portions have the same reference numbers. Referring to a timing chart of FIG. 13B, an operation of the operation mode generating circuit shown in FIG. 13A will be now described.

In the section I, operation mode switching signal MCHG is set at L level, and operation mode switching signal ZMCHG is set at H level. Under this condition, external signals ext.A, ext.B and ext.C satisfy a specific timing condition (all L level in FIG. 13B). Correspondence defining circuit 10 supplies these to mode set enable generating circuit 25 included in mode designating signal generating circuit 20 without changing them. Mode set enable generating circuit 25 determines that an operation mode setting cycle is designated according to a combination of the states of the external signals provided via correspondence defining circuit 10, and sets mode set enable signal MSET to active state of H level.

At this time, if the second set of external signals ext.Z, ext.Y and ext.X are respectively at H, L and H level, correspondence defining circuit 10 outputs these signals as combination DATA(A) of internal states to be supplied to mode set circuit 27 included in mode designating signal generating circuit 20. Mode set circuit 27 activates mode designating signal MODEA according to mode set enable signal MSET from mode set enable generating circuit 25 and combination DATA(A) of internal states.

With reference to the section II next, a case will be described in which operation mode switching signal MCHG is set to H level, and operation mode switching signal ZMCHG is set to L level. In this case, correspondence defining circuit 10 switches a correspondence between external signals and internal signals from the correspondence in the section I since logics of operation mode switching signal MCHG and ZMCHG are different from those described above concerning the section I. If a timing condition (e.g. CBR condition) is satisfied, i.e., external signals ext.A and ext.B are at L level and external signal ext.C is at H level, correspondence defining circuit 10 changes the above states to those in which another timing condition (e.g. WCBR condition) is satisfied, i.e., external signals ext.A, ext.B and ext.C are all set to L level, and the result is supplied to mode set enable generating circuit 25.

Mode set enable generating circuit 25 determines that an operation mode set cycle is designated according to the signals from correspondence defining circuit 10, and sets mode set enable signal MSET to an active state of H level. At this time, the second set of external signals ext.Z, ext.Y and ext.X are respectively at H, L and H level, and correspondence defining circuit 10 changes the internal states to the combination DATA(B) of the internal states shown in FIG. 15 and outputs the result. Under this condition, mode set circuit 27 sets mode designating signal MODEB to an active state of H level as in the structure shown in FIG. 15. The same operation mode is thus designated as the one which is set when operation mode switching signal MCHG is at L level and operation mode switching signal ZMCHG is at H level, external signals ext.A–ext.C are all set to L level (a prescribed timing condition), and external signals ext.Z–ext.X are all at H level.

Any of the structures described in detail in the first to fourth embodiments may be employed as the structure of correspondence defining circuit 10. An appropriate circuit structure may be utilized according to the combination of the states of the external signals employed.

According to the fifth embodiment of the invention, the number of the operation modes designated according to different states of external signals can be increased using an operation mode switching signal, so that the inventive device is applicable to various applications in which different states of external signals are employed without changing its chip structure (internal structure) even if the inventive device is, for example, a DRAM of multiple functions which has many operation modes. This is because the inventive device is structured such that a correspondence between the states of external signals and internal signals is switched according to an operation mode switching signal, for the external signals used for designating and specifying an operation mode, i.e., a first set of external signals which designates an operation mode depending on a timing condition, and a second set of external signals which specifies an operation mode according to their logic values.

Although 1 bit signal (precisely, 2 bits of complementary signals) is used as an operation mode switching signal in the first to fifth embodiments described above, an operation mode switching signal of multi-bit may be utilized for setting a correspondence between an internal signal and an external signal. The number of possible applications can thus be increased.

According to the invention described above, the inventive device is made applicable to various applications in which different states of external signals are utilized without changing its chip structure (internal structure) since the inventive device is structured such that a correspondence between an external signal and an internal signal is changed according to an operation mode switching signal.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    an internal circuit, having a plurality of operation modes, which operates in a selected operation mode from among said plurality of operation modes according to a state of an internal signal; and
    an operation mode setting circuit coupled to said internal circuit and configured for generating said internal signal corresponding to a state of an externally supplied external signal, and changing a designated relationship between a state of said external signal and a state of said internal signal in response to an operation mode switching signal.

2. The semiconductor device according to claim 1, wherein said operation mode setting circuit is further configured for outputting an external signal of a first state as a first internal signal of said first state corresponding to said external signal when said operation mode switching signal is at a first level, and changing an external signal of said first state to the first internal signal of a second state which is different from said first state to output when said operation mode switching signal is at a second level.

3. The semiconductor device according to claim 1, wherein said operation mode setting circuit is further configured for outputting an external signal of a first state as a first internal signal corresponding to said first state in response to a first level of said operation mode switching signal, and changing an external signal of a second state to the first internal signal corresponding to said first state for outputting in response to a second level of said operation mode switching signal.

4. The semiconductor device according to claim 1, wherein said operation mode setting circuit includes an inverter which inverts the external signal in response to an operation mode switching signal of said second level.

5. The semiconductor device according to claim 1, wherein each of said external signal and said internal signal is a multi-bit signal, and said operation mode setting circuit is further configured for switching a connection between an input node receiving said external signal and an output node outputting a first internal signal corresponding to said external signal in response to said operation mode switching signal.

6. The semiconductor device according to claim 1, wherein said internal circuit includes a plurality of memory cells, and said external signal includes a signal which controls an access to said plurality of memory cells.

7. The semiconductor device according to claim 1, wherein said internal circuit includes a plurality of memory cells, and said external signal includes a prescribed bit of a multi-bit address signal which designates a memory cell to be accessed out of said plurality of memory cells.

8. The semiconductor device according to claim 1, wherein operation mode setting circuit includes:

a correspondence defining circuit responsive to said operation mode switching signal for establishing the designated relationship between the external signal and a first internal signal, and for receiving the external signal to generate the first internal signal; and a mode designating signal generation circuit coupled to said correspondence defining means for generating said internal signal in accordance with the state of said first internal signal.

9. The semiconductor device according to claim 8, wherein said external signal and said first internal signal each include a plurality of sub signals, and wherein said mode designating signal generation circuit comprises:

detection means responsive to a part of the sub signals of said first signal for detecting that said part of the sub signals satisfies a predetermined timing condition, and generating means, coupled to said detection means, responsive to the detection of the predetermined timing condition being satisfied, for generating the internal signal in accordance with a logic value of remaining sub signals of said first internal signal.

10. The semiconductor device according to claim 9, wherein said operation mode setting circuit is responsive to said operation mode switching signal for establishing the designated relationship between the remaining sub signals of the first internal signal and states of the internal signal.

11. The semiconductor device according to claim 9, wherein said operation mode setting circuit is responsive to said operation mode switching signal for establishing the designated relationship between said part of the sub signals of the first internal signal and states of the internal signal.

12. The semiconductor device according to claim 9, wherein said operation mode setting circuit is responsive to said operation mode switching signal for establishing the designated relationship between said part of the sub signals and said remaining sub signals of the first internal signal and states of the internal signal.

13. A semiconductor device comprising:

an internal circuit, having a plurality of operation modes, which operates in a selected operation mode from among said plurality of operation modes according to a state of an internal signal; and an operation mode setting circuit coupled to said internal circuit and configured for generating said internal signal according to a designated relationship with a state of an externally supplied external signal, and changing said designated relationship between said state of said external signal and said state of said internal signal in response to an operation mode switching signal.

* * * * *